(12) United States Patent
Delzer et al.

(10) Patent No.: US 8,552,808 B2
(45) Date of Patent: Oct. 8, 2013

(54) APPARATUS AND METHOD FOR OSCILLATOR RESONATOR POWER CONTROL

(75) Inventors: Donald J. Delzer, Beaverton, OR (US); Laszlo J. Dobos, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 27 days.

(21) Appl. No.: 13/151,809

(22) Filed: Jun. 2, 2011

(65) Prior Publication Data

US 2012/0306583 A1 Dec. 6, 2012

(51) Int. Cl.
*H03L 7/099* (2006.01)
(52) U.S. Cl.
USPC ............ 331/185; 331/182; 331/183; 331/186
(58) Field of Classification Search
USPC .................. 331/158, 160, 182, 183, 185, 186
See application file for complete search history.

(56) References Cited

U.S. PATENT DOCUMENTS

| 5,126,697 A * | 6/1992 | Nauta et al. ................ 331/177 R |
| 5,959,505 A * | 9/1999 | Ushiyama ...................... 331/158 |
| 6,946,923 B2 * | 9/2005 | Knickerbocker et al. ..... 331/160 |
| 2009/0027133 A1 * | 1/2009 | Seliverstov .................... 331/158 |
| 2009/0278612 A1 * | 11/2009 | Lim ................................. 331/8 |

* cited by examiner

*Primary Examiner* — Joseph Chang
*Assistant Examiner* — Jeffrey Shin
(74) *Attorney, Agent, or Firm* — Michael A. Nelson

(57) ABSTRACT

Embodiments of the present invention provide an oscillator having circuitry that measures the power dissipated in a resonator and circuitry that controls the power delivered to the resonator in response to the measured power. In some embodiments, the circuitry that measures the power dissipated in the resonator comprises circuitry that measures the voltage across the resonator, circuitry that measures the current through the resonator, and circuitry that calculates the power dissipated in the resonator based on the measured voltage and current.

16 Claims, 4 Drawing Sheets

APPARATUS AND METHOD FOR OSCILLATOR RESONATOR POWER CONTROL

FIELD OF THE INVENTION

The present invention relates to oscillators, and more particularly to low-noise oscillators.

BACKGROUND OF THE INVENTION

The goal of low-noise oscillator design is to produce a signal having a high signal-to-noise ratio by maximizing the amplitude of the signal and minimizing the circuit noise level. Maximizing the energy stored in a resonator results in improved phase-noise performance because a high signal amplitude is available to the resonator load. When the energy stored in a resonator is maximized, the power dissipated in it is also at maximum.

One approach to maximizing the power dissipated in a resonator is to deliver constant power to it by limiting the voltage or current delivered to it. However, power-limited resonators such as crystal resonators can have large tolerances in their equivalent resistance at resonance. For example, the resistance of a crystal resonator might vary ±40% about its nominal resistance. When constant voltage or constant current is delivered to such a resonator, the power dissipated in the resonator will vary by that resistance tolerance.

What is desired is an oscillator capable of maximizing signal-to-noise ratio with a resonator having a large resistance tolerance.

SUMMARY OF THE INVENTION

Embodiments of the present invention provide an oscillator having circuitry that measures the power dissipated in a resonator and circuitry that controls the power delivered to the resonator in response to the measured power. In some embodiments, the circuitry that measures the power dissipated in the resonator comprises circuitry that measures the voltage across the resonator, circuitry that measures the current through the resonator, and circuitry that calculates the power dissipated in the resonator based on the measured voltage and current.

The objects, advantages, and other novel features of the present invention are apparent from the following detailed description when read in conjunction with the appended claims and attached drawings.

DETAILED DESCRIPTION OF THE INVENTION

Figure 1:
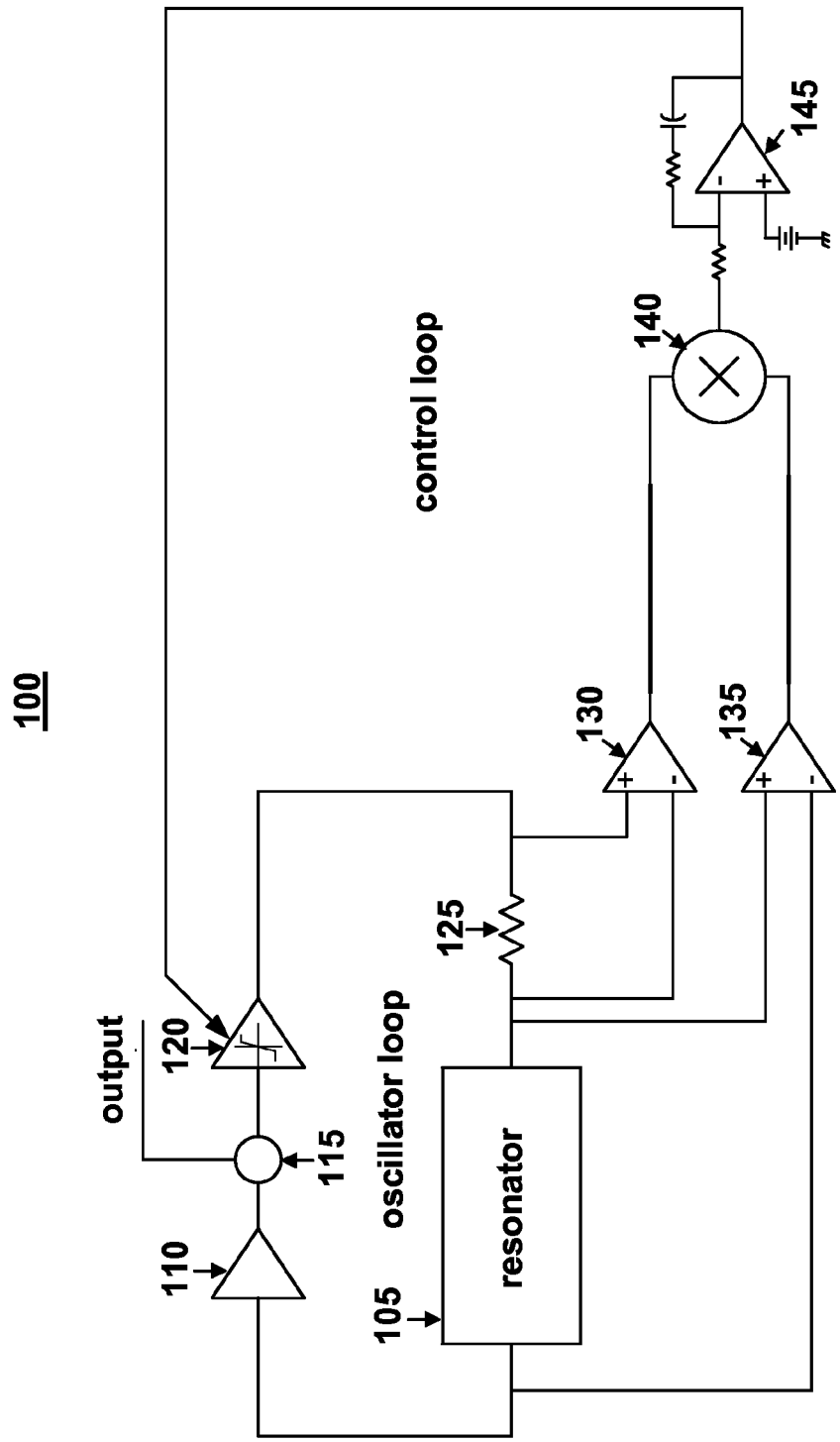
FIG. 1 depicts a simplified, schematic diagram of an oscillator according to a first embodiment of the present invention.

FIG. 1 depicts an oscillator 100 according to an embodiment of the present invention. The oscillator 100 consists of an oscillator loop and a control loop.

In the oscillator loop, an output of a resonator 105 is coupled to an input of an amplifier 110. An output of the amplifier 110 is coupled to an input of a coupler 115. A first output of the coupler 115 serves as an output of the oscillator, and a second output of the coupler 115 is coupled to an input to a variable amplitude limiter 120. The variable amplitude limiter 120 can be a variable voltage limiter, a variable current limiter, a limiting amplifier, or the like. An output of the variable amplitude limiter 120 is coupled to a first terminal of a current sense resistor 125. A second terminal of the current sense resistor 125 is coupled to an input of the resonator 105.

In the control loop, a first input of a first differential amplifier 130 is coupled to the first terminal of the current sense resistor 125, and a second input of the first differential amplifier 130 is coupled to the second terminal of the current sense resistor 125. A first input of a second differential amplifier 135 is coupled to the input of the resonator 105, and a second input of the second differential amplifier 135 is coupled to the output of the resonator 105. An output of the first differential amplifier 130 is coupled to a first input of a multiplier 140. An output of the second differential amplifier 135 is coupled to a second input of the multiplier 140. An output of the multiplier 140 is coupled to an input of a circuit 145 that low-pass filters the output of the multiplier 140 and compares the filtered result to a reference power level. The circuit 145 is illustrated in the Drawings as an amplifier circuit having a particular configuration, however it will be appreciated that the circuit 145 may also be implemented in various other ways such as a proportional (fixed gain) amplifier, an integrator, a low-pass filter, or any other transfer function selected by a designer to suit his or her needs. An output of the circuit 145 is coupled to a control input of the variable amplitude limiter 120.

In operation, in the oscillator loop, the resonator 105 produces an oscillator signal that is (1) amplified by the amplifier 110, (2) passed through the coupler 115, (3) limited by the variable amplitude limiter 120, (4) passed through the current sense resistor 125, and (5) fed back into the resonator 105. At the same time, in the control loop, the first differential amplifier 130 produces a signal that represents the current through the resonator 105 ("the current signal"), the second differential amplifier 135 produces a signal that represents the voltage across the resonator 105 ("the voltage signal"), and the multiplier 140 multiplies the voltage signal and the current signal together to produce a signal that represents the calculated power dissipated in the resonator 105 ("the power signal"). The circuit 145 low-pass filters the power signal, compares the filtered result to the reference power level, and produces a signal that is proportional to the difference between the two. This signal is fed back to the control input of the variable amplitude limiter 115 and used to control the power delivered to the resonator 105. In this manner, the power dissipated within the resonator 105 is held constant regardless of any variation in its equivalent resistance at resonance.

Now, in more detail, the calculated power (P) is equal to:

$$P = v \times \sin(\omega t) \times i \times \sin(\omega t + \beta) \quad \text{(Equation 1)}$$

where v is voltage across the resonator 105, i is the current through the resonator 105, ω is the angular frequency of the voltage and current signals, and β is the phase difference between the voltage and current signals.

If the voltage and current signals are in-phase, then β=0 and Equation 1 simplifies to:

$$P = \frac{1}{2}vi + \frac{1}{2}vi \times \sin(2\omega t) \qquad \text{(Equation 2)}$$

The circuit 145 low-pass filters this power signal, and thus isolates the DC component, which is proportional to the real power dissipated in the resonator 105.

If the voltage and current signals are not in-phase, then $\beta \neq 0$ and Equation 1 becomes:

$$P = A_0 + A_1 \times \sin(2\omega t + \beta) \qquad \text{(Equation 3)}$$

where $$A_0 = \frac{1}{2}vi \times \cos(\beta) \qquad \text{(Equation 4)}$$

The circuit 145 low-pass filters this power signal and thus isolates $A_0$, which is proportional to the real power dissipated in the resonator 105.

Figure 2:
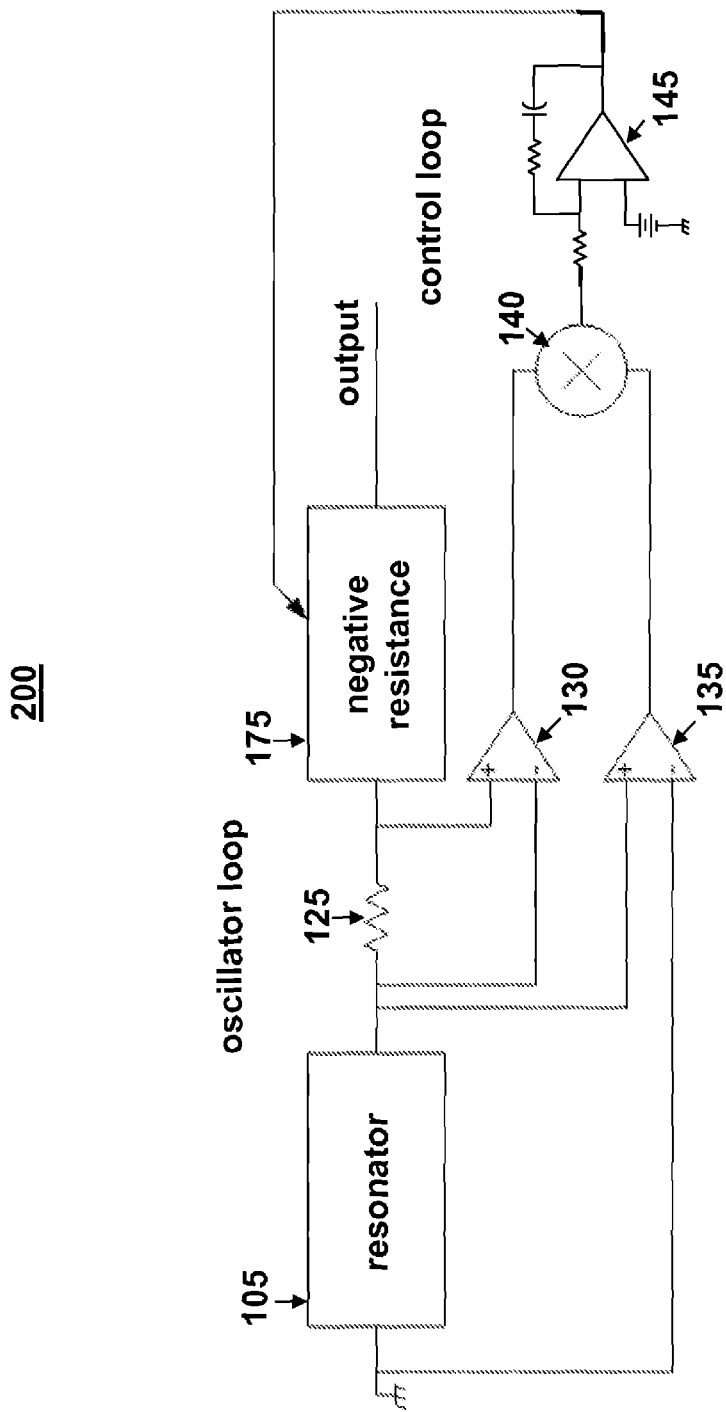
FIG. 2 depicts a simplified, schematic diagram of an oscillator according to a second embodiment of the present invention.

One of ordinary skill in the art will appreciate that various changes may be made to the oscillator 100 without departing from the spirit and scope of the present invention. For example, the current sense resistor 125 could be placed at a different location within the oscillator loop (e.g., at the output of the resonator 105 instead of at the input), the coupler 115 could be placed at a different location within the oscillator loop (e.g., at the output of the variable amplitude limiter 120 instead of at the input), the amplifier 110 and the variable amplitude limiter 120 could be combined into a single circuit, and so on. Another example of such a change is shown in FIG. 2 where the oscillator loop is implemented using a negative resistance generator 175. In this embodiment, one terminal of the resonator 105 is coupled to ground, and the other terminal of the resonator 105 is coupled to a terminal of the current sense resistor 125. The other terminal of the current sense resistor 125 is coupled to a first terminal of the negative resistance generator 175, and a second terminal of the negative resistance generator 175 provides the output of the oscillator 200. As in the oscillator 100 of FIG. 1, in the control loop, the first differential amplifier 130 measures the current through the resonator 105 to produce the current signal, the second differential amplifier 135 measures the voltage across the resonator 105 to produce the voltage signal, the multiplier 140 multiplies the voltage signal and the current signal together to produce the power signal, the circuit 145 low-pass filters the power signal, compares the filtered result to the reference power level, and produces a signal that is proportional to the difference between the two. However, now, that signal is fed back to a control input of the negative resistance generator 175 and used to control the power dissipated in the resonator 105.

Figure 3:
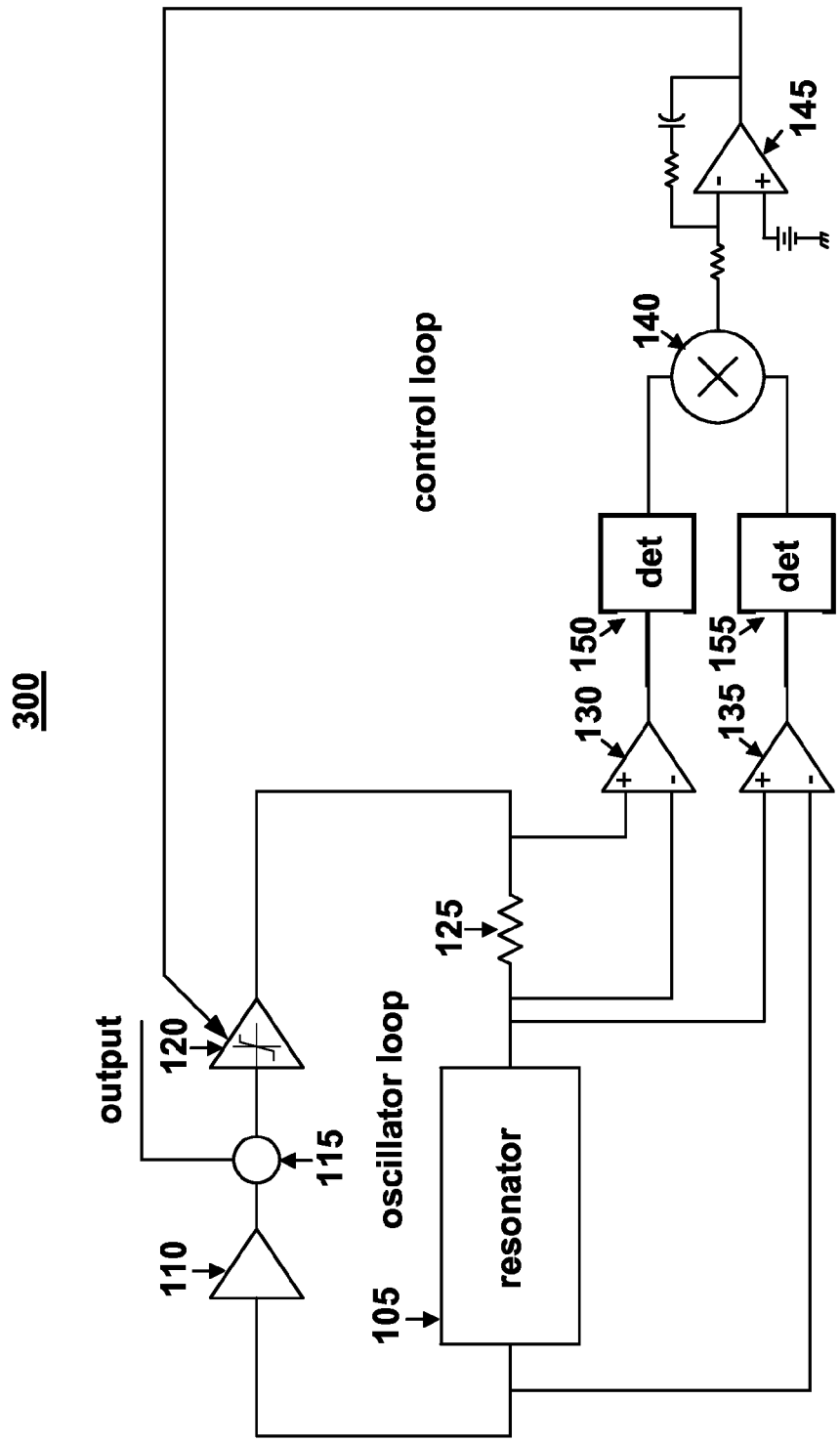
FIG. 3 depicts a simplified, schematic diagram of an oscillator according to a third embodiment of the present invention.

Referring now to FIG. 3, in some embodiments, a first detector 150 is coupled between the output of the first differential amplifier 130 and the first input of the multiplier 140, and a second detector 155 is coupled between the output of the second differential amplifier 135 and the second input of the multiplier 140.

The detectors 150, 155 may be radio frequency (RF) detectors, meaning that they detect the oscillator signal directly, or baseband detectors, meaning that they detect the baseband envelope of the oscillator signal. Examples of RF detectors include analog multipliers, mixers, and the like. Examples of baseband detectors include diode and capacitor-based envelope detection circuits and the like.

In cases where the impedance of the resonator 105 is composed of substantially reactive terms, RF detectors are preferred because they preserve the phase information of the voltage and current signals. Loss of phase information results in the over-estimation of the power dissipated in the resonator 105.

In cases where baseband detectors are used, the phase difference ($\beta$) is not detected. Therefore, the output of the multiplier 140 is proportional to the product of the peak value of the voltage signal and the peak value of the current signal. The advantages of using baseband detectors are that the multiplier 140 does not need to work at high speed, it does not need to have as much range, and it does not need to be highly accurate, so the multiplier 140 can be cheaper.

Figure 4:
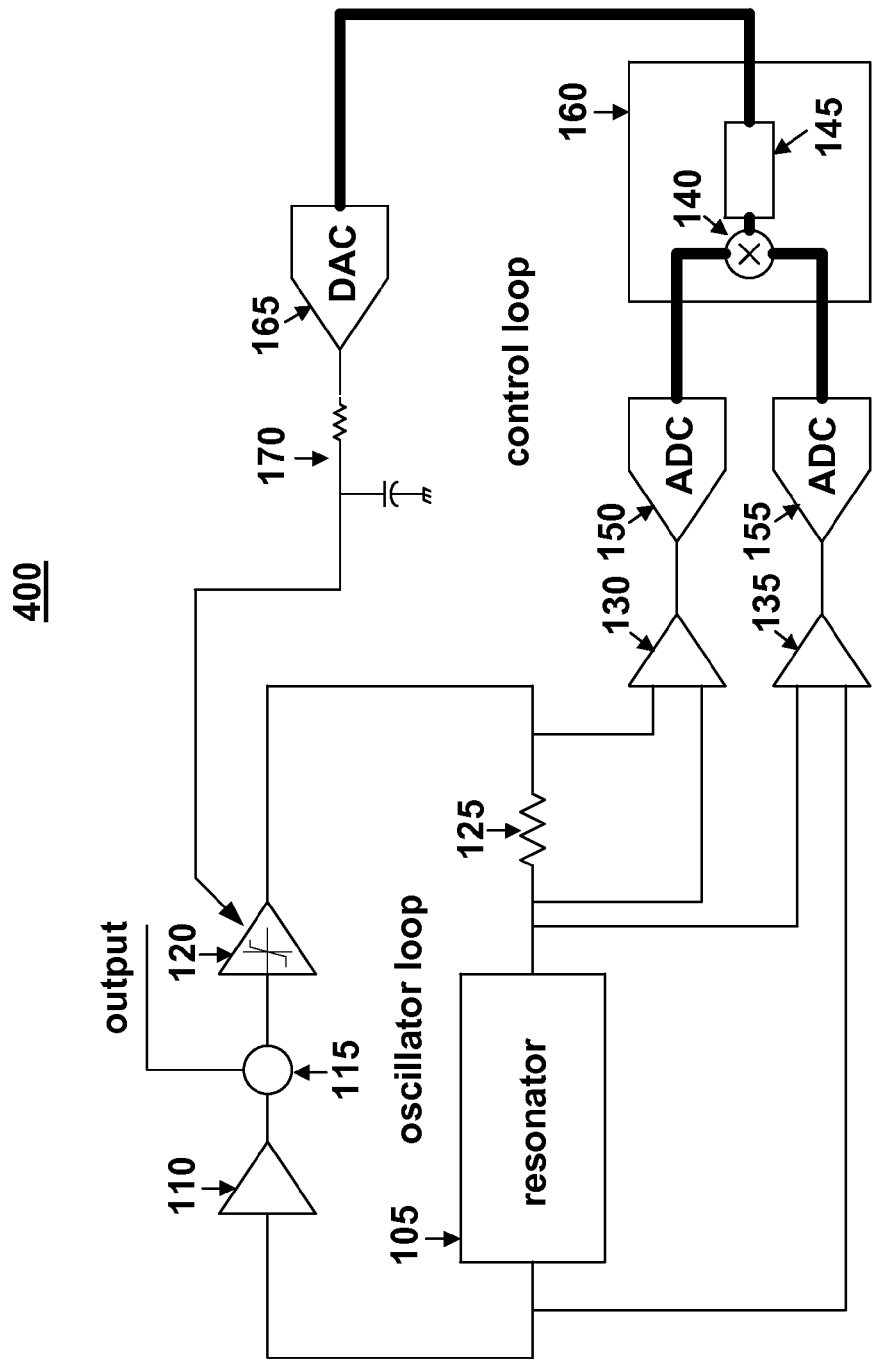
FIG. 4 depicts a simplified, schematic diagram of an oscillator according to a fourth embodiment of the present invention.

Referring now to FIG. 4, in some embodiments, the detectors 150, 155 are analog-to-digital converters (ADCs) that digitize the voltage and current signals and produce pairs of corresponding digital values. The pairs of digital values are input to a digital processor 160 that calculates the power signal mathematically by multiplying the pairs of digital values together, low-pass filters the power signal, compares the filtered result to the reference power level, and produces a digital signal that is proportional to the difference between the two. The digital processor 160 may be a general purpose microprocessor, a digital signal processor (DSP), an application specific integrated circuit (ASIC), a field-programmable gate array (FPGA), or the like. The resulting digital signal is converted back into an analog signal with a digital-to-analog converter (DAC) 165 and optionally filtered with a low-pass filter 170 before being applied to the variable amplitude limiter 120.

The ADCs 150, 155 are clocked by a sampling clock (not shown) that is either synchronous with the oscillator signal or asynchronous with it, and either faster than the oscillator signal, equal to it, or slower than it.

In cases where the sampling clock is asynchronous with the oscillator signal, the oscillator 400 includes another oscillator (not shown) that provides the sampling clock. In cases where the sampling clock is synchronous with the oscillator signal, the oscillator 400 includes circuitry (not shown) such as a phase-locked loop, a frequency divider, or the like that derives the sampling clock from the oscillator signal.

The ADCs 150, 155 are considered RF detectors if the sampling clock is faster than the oscillator signal, or they are considered baseband detectors if the sampling clock is equal to or slower than the oscillator signal.

If the ADCs 150, 155 are baseband detectors, then the sampled oscillator signal is translated to a lower frequency by the sampling clock.

The sampling clock can be a sub-harmonic of the oscillator signal. In that case, care should be used in setting the timing and synchronization of the voltage and current signals to the ADCs 150, 155, and also the timing and synchronization of the sampling clock to the ADCs 150, 155. This is because the ADCs 150, 155 will produce a series of constant values, i.e., a DC level, with that level being the value of the oscillator signal at the sampling phase. However, the oscillator signal has negative values, zero values, and positive values, and only some of those values provide meaningful power calculations. For example, if the ADC 150 were to sample the current signal each time is passes through zero, then the calculated power would be zero ($V \times 0 = 0$), which is an impossible result. Thus, it is advantageous to set the timing and synchronization so that the ADCs 150, 155 sample the voltage and current signals at their peak amplitudes.

If the sampling clock is asynchronous with the oscillator signal, then the real and imaginary parts of the calculated power can be determined mathematically using the digital processor 160. In this case, it is not necessary to control the timing between the sampling clock and the ADCs 150, 155 because they are not correlated. However, care should be used in setting the differential delay between the resonator 105 and the ADCs 150, 155.

The ADCs 150, 155, digital processor 160, and DAC 165 might inject unwanted noise into the oscillator signal. This noise can be reduced by sampling the power at startup or infrequent intervals, and then disconnecting the control loop while holding the control input of the variable-amplitude limiter 120 at the last sampled power. This approach provides quiet operation when the power is not sampled.

In order to minimize the amount of required circuitry, some embodiments (not shown) use a single ADC instead of two ADCs. The input of the single ADC is coupled to a switch that toggles back and forth between the output of the first differential amplifier 130 and the second differential amplifier 135, and the output of the single ADC is coupled to an input of the digital processor 160. In this manner, the single ADC alternately samples the voltage signal and the current signal, and the resulting combined samples are separated in the digital processor 160 and then processed as described above.

It will be appreciated from the foregoing discussion that the present invention represents a significant advance in the field of low-noise oscillator design. Although specific embodiments of the invention have been illustrated and described for purposes of illustration, it will be understood that various modifications may be made without departing from the spirit and scope of the invention. Accordingly, the invention should not be limited except as by the appended claims.

What is claimed is:

1. An oscillator comprising:
    circuitry that measures a power dissipated in a resonator; and
    circuitry that controls a power delivered to the resonator in response to the measured power;
    wherein the circuitry that the power dissipated in the resonator comprises:
        circuitry that measures a voltage across the resonator;
        circuitry that measures a current through the resonator; and
        circuitry that calculates the power dissipated in the resonator based on the measured voltage and the measured current.

2. An oscillator as in claim 1 wherein the circuitry that measures the voltage across the resonator comprises a differential amplifier.

3. An oscillator as in claim 1 wherein the circuitry that measures the current through the resonator comprises a current sense resistor and a differential amplifier.

4. An oscillator as in claim 1 wherein the circuitry that calculates the power dissipated in the resonator comprises a multiplier.

5. An oscillator as in claim 1 wherein the circuitry that controls the power delivered to the resonator comprises:
    circuitry that low-pass filters the measured power; and
    circuitry that compares the filtered measured power to a reference power level.

6. An oscillator as in claim 1 wherein the circuitry that controls a power delivered to the resonator comprises a variable amplitude limiter.

7. An oscillator as in claim 1 wherein the circuitry that measures the voltage across the resonator comprises a detector.

8. An oscillator as in claim 7 wherein the detector is a baseband detector.

9. An oscillator as in claim 7 wherein the detector is a radio frequency detector.

10. An oscillator as in claim 7 wherein the detector is an analog-to-digital converter.

11. An oscillator as in claim 1 wherein the circuitry that measures the current through the resonator comprises a detector.

12. An oscillator as in claim 11 wherein the detector is a baseband detector.

13. An oscillator as in claim 11 wherein the detector is a radio frequency detector.

14. An oscillator as in claim 11 wherein the detector is an analog-to-digital converter.

15. A method comprising the steps of:
    measuring a power dissipated in a resonator; and
    controlling a power delivered to the resonator in response to the measured power;
    wherein the step of measuring the power dissipated in the resonator comprises the steps of:
        measuring a voltage across the resonator;
        measuring a current through the resonator; and
        calculating a power dissipated in the resonator based on the measured voltage and the measured current.

16. An oscillator comprising:
    means for measuring a power dissipated in a resonator; and
    means for controlling a power delivered to the resonator in response to the measured power;
    wherein the means for measuring the power dissipated in the resonator comprises:
        means for measuring a voltage across the resonator;
        means for measuring a current through the resonator; and
        means for calculating a power dissipated in the resonator based on the measured voltage and the measured current.

* * * * *